United States Patent
Kobashi et al.

[11] Patent Number: 5,923,054
[45] Date of Patent: Jul. 13, 1999

[54] LIGHT EMITTING DIODE WITH TILTED PLANE ORIENTATION

[75] Inventors: Yasuji Kobashi; Tadashige Sato; Hitora Takahashi, all of Ushiku, Japan

[73] Assignee: Mutsubishi Chemical Corporation, Tokyo, Japan

[21] Appl. No.: 08/851,272

[22] Filed: May 5, 1997

Related U.S. Application Data

[63] Continuation of application No. 08/527,597, Sep. 13, 1995, abandoned.

[30] Foreign Application Priority Data

Sep. 13, 1994 [JP] Japan ..................... 6-218470

[51] Int. Cl.$^6$ ............... H01L 33/00; H01L 29/04; H01L 31/036
[52] U.S. Cl. .............. 257/103; 257/94; 257/627; 257/13; 438/973
[58] Field of Search .............. 257/94, 103, 627, 257/628; 438/46, 47, 959, 973

[56] References Cited

U.S. PATENT DOCUMENTS

| | | | |
|---|---|---|---|
| 5,173,751 | 12/1992 | Ota et al. | 257/76 |
| 5,291,033 | 3/1994 | Morishima | 257/13 |
| 5,534,717 | 7/1996 | Murasato et al. | 257/94 |

FOREIGN PATENT DOCUMENTS

| | | | |
|---|---|---|---|
| 5-13815 | 1/1993 | Japan | 257/94 |

OTHER PUBLICATIONS

U.S. Department of Commerce, National Technical Information Service, PB82–162405. Jun. 1980.
Solid State Electronics, vol. 23, pp. 611–619. Dec. 1980.
Japanese Patent Abstract Laid–Open Publication No. 3–16993. Jun. 1989.
Japanese Patent Abstract Laid–Open Publication No. 61–261300. May 1985.

*Primary Examiner*—Mahshid Saadat
*Assistant Examiner*—Allan R. Wilson
*Attorney, Agent, or Firm*—Armstrong, Westerman, Hattori, McLeland & Naughton

[57] ABSTRACT

In a light-emitting diode, which comprises epitaxial wafer where a gallium phosphide or a gallium phosphide arsenide mixed crystal epitaxial layer is grown on a III-V family compound single crystal substrate having zinc blende type crystal structure, the surface of said substrate has a plane tilted by 5 to 16° from a (100) plane toward [010], [001], [0-10] or [00-1], or a plane having crystallographically equivalent crystal plane orientation to this plane. As a result, it is possible to improve light emitting output and to ensure longer service life.

8 Claims, 2 Drawing Sheets

5,923,054

LIGHT EMITTING DIODE WITH TILTED PLANE ORIENTATION

This application is Continuation of application Ser. No. 08/527,597 filed Sep. 13, 1995, now abandoned.

BACKGROUND OF THE INVENTION

The present invention relates to a visible light emitting diode with higher output and longer service life.

In recent years, there have been increasing demands on light emitting diode ("LED"), which is now used instead of incandescent lamp because of its improved performance characteristics.

The increase of the replacement of the incandescent lamp by the LED is attributable to the fact that:

(1) the service life of the incandescent lamp is by about one year;

(2) the light emitted from the incandescent lamp has a continuous spectrum, and a filter is required because beautiful single luminous color ranging from blue to red cannot be obtained from the incandescent lamp; and (3) it is not possible to produce the incandescent lamp in a small size.

On the other hand, LED can solve these problems. However, there are now more strict demands on the quality of LED.

LED is manufactured from an epitaxial wafer, which comprises single crystal substrate of a compound of an element of III-V family of zinc blende (sphalerite) type such as gallium phosphide (GaP), gallium arsenide (GaAs), etc., on which a layer of a desired zinc blende type III-V family compound crystal is epitaxially grown.

This is because the crystals currently available for the substates have many defects and are low in purity, and it is difficult to use them as LED. For this reason, a layer having such a composition as to provide a desired light emitting wavelength is epitaxially grown on the substrate.

As the material for the epitaxial growth layer, a gallium phosphide arsenide ternary mixed crystal layer is used for the manufacture of visible light LED from red to yellow. Also, a gallium phosphide epitaxial layer is used for the manufacture of a green LED.

As a crystal plane of these single crystal substrates, a plane has been used, which is by several degrees tilted from a (100) plane or a (100) plane toward the direction of [111]. In the zinc blende type crystal, the (100) plane has a four-fold axis of symmetry. As a result, it is easier to cleave it in rectangular or square shape or to grow it empirically.

Also, by being tilted by several degrees from the (100) plane toward [111], i.e. by providing the so-called "off-angle", it is possible to form the growth step intentionally on the crystal growing surface and to extremely improve surface conditions of the epitaxial growth layer.

In recent years, with the extension of the applications of LEDs for equipment and devices, LEDs are more frequently used in outdoor applications.

When LEDs are used outdoors, light emitting output must be as high as possible. Further, as for outdoor application, environmental conditions are so severe that light output may decrease within a shorter time than it does in indoor application. Also, in case of a display plate using a large number of LEDs, unevenness in color may occur due to variations in the light emitting output. To overcome these problems, LED must be of higher output and of longer service life.

In a conventional filament type electric bulb, service life is defined as the duration until the filament is exhausted and light is no more emitted. On the other hand, the service life of LED is the duration until light emitting output of LED is decreased to a certain percentage of the initial value.

Having made strenuous efforts to solve the above problems, the present inventors have found that light output and service life of a LED depend on crystal plane orientation (Miller indices) of the substrate.

The above object can be attained by a light emitting diode according to the present invention, which comprises an epitaxial wafer having a monocrystal substrate of a compound of an element of III-V family with crystal structure of zinc blende type where a gallium phosphide or a gallium phosphide arsenide mixed crystal epitaxial layer is grown, whereby the surface of said substrate has one of the following crystallographic crystal plane orientations:

(1) a plane tilted by 5 to 16° from a (100) plane toward [010], [001], [0-10] or [00-1];

(2) a plane tilted by 5 to 16° from a (−100) plane toward [010], [001], [0-10] or [00-1];

(3) a plane tilted by 5 to 16° from a (010) plane toward [100], [−100], [001] or [00-1];

(4) a plane tilted by 5 to 16° from a (0-10) plane toward [100], [−100], [001] or [00-1];

(5) a plane tilted by 5 to 16° from a (001) plane toward [100], [−100], [010] or [0-10]; or (6) a plane tilted by 5 to 16° from a (00-1) plane toward [100], [−100], [010] or [0-10].

All of these crystal plane orientations are crystallographically equivalent crystal plane orientations.

As the monocrystal substrate of a compound of III-V family element of zinc blende type, a GaAs substrate, or more preferably a GaP substrate is used. This is because GaP substrate has a smaller difference in composition from the epitaxial layer.

It is preferable that crystal plane orientation of these substrates is one of the following crystal plane orientations because high light emitting output and longer LED service life are ensured:

(1) a plane tilted by 11 to 15° from a (100) plane toward [010], [001], [0-10] or [00-1];

(2) a plane tilted by 11 to 15° from a (−100) plane toward [010], [001], [0-10] or [00-1];

(3) a plane tilted by 11 to 15° from a (010) plane toward [100], [−100], [001] or [00-1];

(4) a plane tilted by 11 to 15° from a (0-10) plane toward [100], [−100], [001] or [00-1];

(5) a plane tilted by 11 to 15° from a (001) plane toward [100], [−100], [010] or [0-10]; or (6) a plane tilted by 11 to 15° from a (00-1) plane toward [100], [−100], [010] or [0-10].

If the direction of tilt angle is other than the above, light output and service life of LED are not improved. If tilt angle is out of the above range, it is not preferable because light output and service life of LED are not improved.

For epitaxial growth of a GaP layer or gallium phosphide arsenide mixed crystal layer, i.e. $GaAs_{1-x}P_x$ (0.45<x<1), using these substrates, liquid phase growth method may be used. More preferably, vapor phase growth method, e.g. halogen transport method, is used. This is because it is difficult to change the composition smoothly by the liquid phase growth method.

In the vapor phase growth method, a graphite or a quartz holder is placed in a reactor made of quartz, and material gas is introduced to heat for epitaxial growth.

In case a gallium phosphide arsenide mixed crystal ($GaAs_{1-x}P_x$; 0.45<x<1) is epitaxially grown on a GaP substrate, lattice mismatch is found in lattice constant of the substrate and the epitaxial layer. To decrease crystal defects due to lattice mismatch of a light emitting layer having a certain composition, a layer called "graded layer" with a composition gradually changing from the substrate to the light emitting layer is provided between the substrate and the epitaxial layer.

Also, in order to improve light emitting output when the LED is formed, nitrogen (N) is doped on the light emitting layer as an isoelectronic trap in addition to dopants to attain normal carrier concentration.

DETAILED DESCRIPTION OF THE PREFERRED EMBODIMENT

Figure 1:
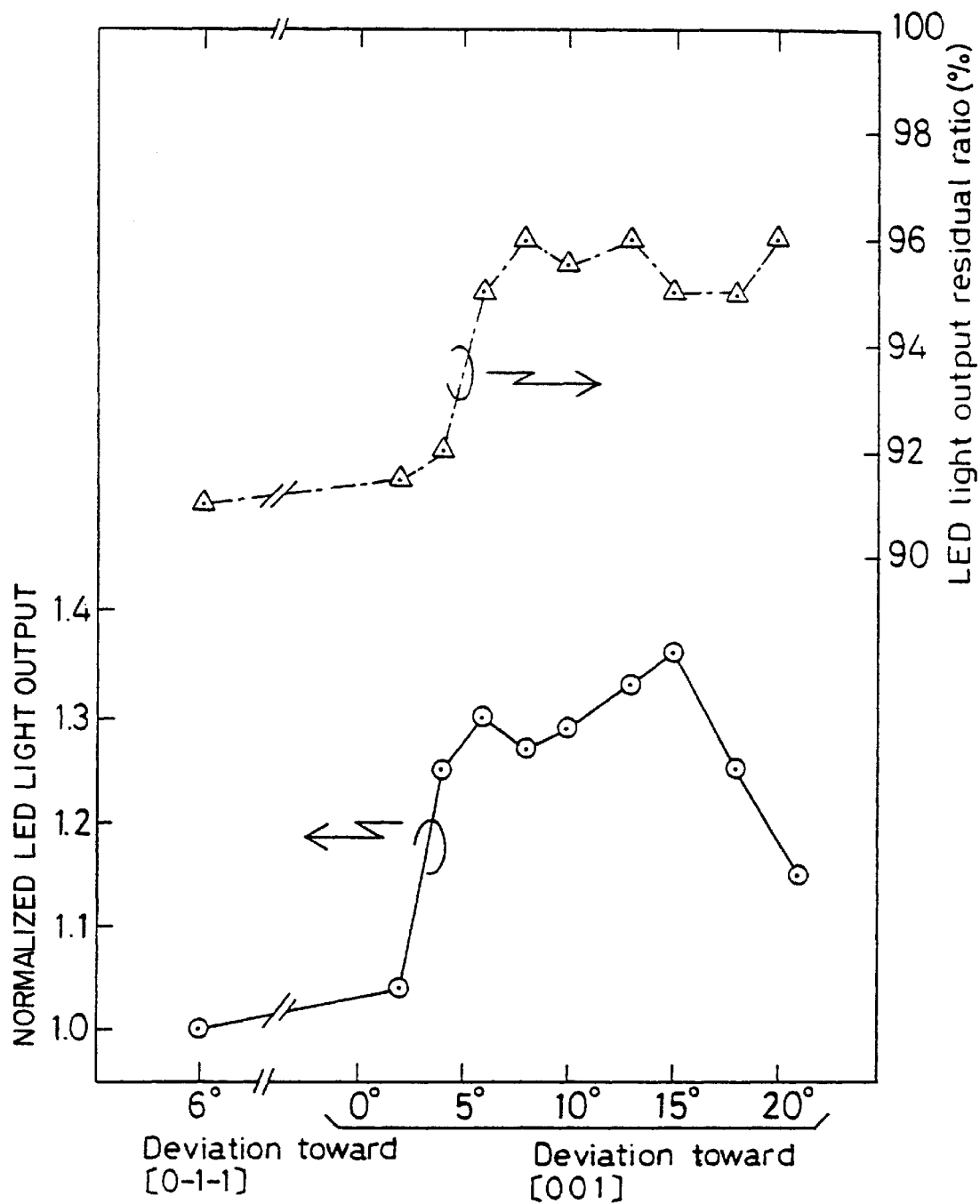
FIG. 1 is a graphic representation showing relationship between light output or service life of a light emitting diode and crystal plane orientations of the substrate.

A GaP substrate and a high purity gallium (Ga) were placed at designated positions in an epitaxial reactor equipped with a quartz boat for storing Ga. A GaP substrate doped with sulfur (S) by 3 to $10 \times 10^{17}$ atoms/ml was used.

Crystal plane orientations of the substrate were as follows:

(1) As the examples, GaP substrates each having a plane tilted by 6°, 8°, 10°, 13° and 15° from a (100) plane toward [001] were employed.

(2) As the comparative examples, GaP substrates each having a plane tilted by 2°, 4°, 18° and 20° from a (100) plane toward [001] and a GaP substrate having a plane deviated by 6° from a (100) plane toward [0-1-1] as used in the past were employed.

These substrates were placed on the holders at the same time. The holders were then rotated at 3 rpm. Next, nitrogen gas ($N_2$) was introduced into the reactor for 15 minutes, and after completely replacing and removing the air, high purity hydrogen ($H_2$) was introduced at 9500 ml/min. as carrier gas. Thus, the flowing of $N_2$ was stopped, and temperature raising process was started.

After confirming that the temperature values at the portion equipped with the quartz boat with Ga melt and at the portion with GaP single crystal substrate were maintained at constant levels of 800° C. and 930° C. respectively, vapor phase growth of $GaAs_{1-x}P_x$ epitaxial film having peak light emitting wavelength of 630±10 nm was started.

At first, diethyltellurium (($C_2H_5)_2$Te), which is an n-type impurity diluted with hydrogen gas to the concentration of 50 ppm, was introduced at 15 ml/min., and high purity hydrogen chloride (HCl) gas was blown into the Ga melt of the quartz boat at a rate of 370 ml/min. to generate GaCl as III family element component of the periodic table, and the gas was blown out of the Ga melt. On the other hand, as V family element component of the periodic table, phosphine ($PH_3$) diluted with hydrogen to the concentration of 10% was introduced at a rate of 910 ml/min., and a GaP layer, i.e. a first layer, was grown on GaP single crystal substrate.

Next, without changing the introducing quantities of ($C_2H_5)_2$Te, HCl, and $PH_3$ gases, arsine ($AsH_3$) diluted with hydrogen to the concentration of 10% was introduced with gradual increase at the rate of 0 ml/min. to 432 ml/min. At the same time, temperature of the GaP substrate was gradually lowered from 930° C. to 870° C., and second $GaAs_{1-x}P_x$ epitaxial layer was grown on the first GaP epitaxial layer for 90 minutes.

For the next 30 minutes, a third $GaAs_{1-x}P_x$ epitaxial layer was grown on the second GaP epitaxial layer without changing the introducing quantities of ($C_2H_5)_2$Te, HCl, $PH_3$, and $AsH_3$ and maintaining at the rate of 15 ml, 370 ml, 910 ml and 432 ml per minute respectively.

For the last 50 minutes, a fourth $GaAs_{1-x}P_x$ epitaxial layer was grown on the third GaP epitaxial layer without changing the quantities of ($C_2H_5)_2$Te, HCl, $PH_3$, and $AsH_3$ and adding high purity ammonium gas ($NH_3$) at a rate of 210 ml/min. to add for nitrogen isoelectronic trap. Thus, vapor phase growth process has been completed.

Film thickness of each of the first, second, third and fourth epitaxial layers was 5 μm, 39 μm, 15 μm and 27 μm respectively.

Mixed crystal ratio x of the fourth epitaxial layer was 0.67, and n-type carrier concentration was $1.3 \times 10^{16}$ $cm^{-3}$.

In the surface conditions of the epitaxial layers, in case substrates tilted by 2° and 4° from the (100) plane toward [001] were used, crystal surface defects of 1 to 2/$cm^{-2}$ were found, while almost no crystal surface defects were found in other cases.

Next, Zn as p-type impurity and an epitaxial wafer without coating were sealed in a quartz ampoule with $ZnAs_2$ as diffusion source. After diffusing at temperature of 720° C., p-n junction was formed at a depth of 5 μm from the surface. Then, LED processes such as photo-etching, electrode formation by vacuum evaporation, etc. were carried out, and mesa type LED chips of 220 μm in diameter were prepared all over the surface. For all LEDs, light emitting output, wavelength, and electrical characteristics were determined.

The light emitting wavelength was 631±3 nm, and there was no change due to the difference of off-angle. There was also no difference in electrical characteristics. To determine light emitting output, LED was mounted on T0-18 header, and light was emitted using an integrating sphere, determining the light output by photodiode.

The unit of the light emitting output was arbitrary. The light output of a LED using a substrate tilted by 6° from the (100) plane toward [0-1-1] was normalized as 1.

The curve in the lower portion of FIG. 1 shows the relationship between the normalized light emitting output and tilt angle of the substrate.

FIG. 1 also shows the relationship between light emitting output and residual ratio of light output, i.e. the relationship between service life of LED and tilt angle of the substrate.

Light output was determined at room temperature and at electric current of 20 mA without molding of epoxy resin.

To determine service life of LED, the ratio of light output, after pulses of DUTY=½ were given at room temperature and at current density of 240 A/$cm^2$, to the initial light output was measured.

It was found that, in case a substrate having crystal plane orientation within the range of the present invention was used, light emitting output of LED was increased by 25 to 35% compared with the LED of the comparative example.

Also, light output reached the maximum when the tilt angle was within the range of 11 to 15°.

The service life of LED was 91% in the substrate having crystal plane orientation tilted by 6° from the (100) plane toward [0-1-1], while, in the substrate within the range of the present invention, it was as high as 94 to 96%.

The service life of LED reached the maximum when tilt angle was within the range of 6 to 13°.

Further, when the tilt angle was within the range of 5 to 9°, there were fewer defects in dicing process to fabricate chips, and the fabrication was easier.

When the tilt from (100) exceeded 16°, defects in the dicing process in chip fabrication occurred by 2% or more.

Figure 2:
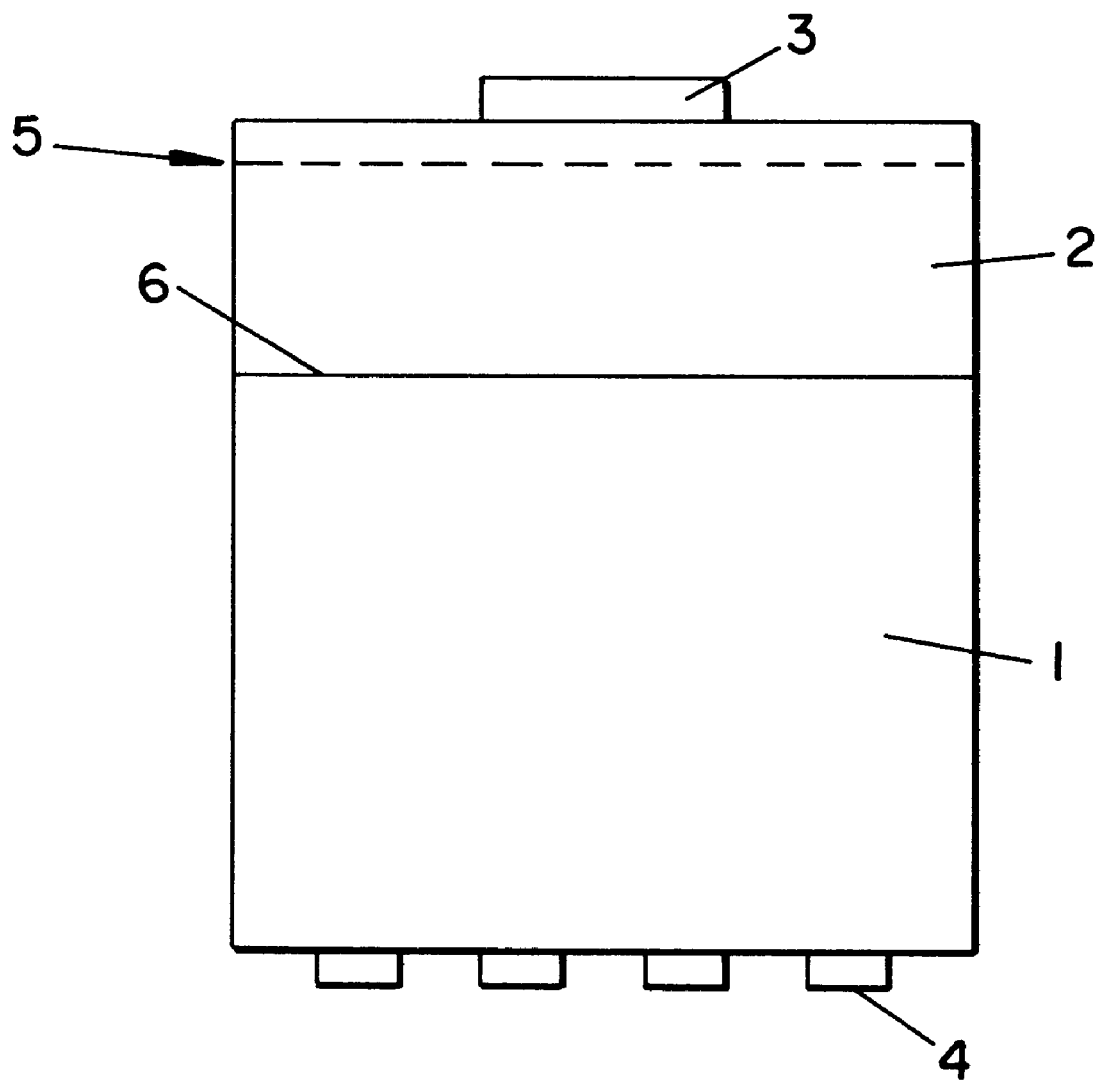
FIG. 2 is a view of the light emitting diode of the present invention.

FIG. 2 shows the light emitting diode of the present invention, which includes a substrate 1, epitaxial layer 2, p-side electrode 3, n-side electrode 4, p-n junction 5, and plane tilt 6.

By the present invention, it is possible to improve light output and to ensure longer service life of LED compared with the conventional type epitaxial wafer. The improvement in the service life is 10% or less in terms of figures and seems to be slight, while it gives very strong effects when diversified applications and demands on higher reliability of LED are taken into account. It is needless to say that effects of crystal plane orientations of the substrates are the same even when other vapor phase growth method, e.g. organic metal vapor phase method or chloride method, is used.

What we claim are:

1. A light emitting diode, comprising an epitaxial wafer having a single crystal substrate of a compound of an element of III-V family with crystal structure of zinc blende type where a gallium phosphide or a gallium phosphide arsenide mixed crystal epitaxial layer is grown, whereby the surface of said substrate has one of the following crystallographic crystal plane orientations:

(1) a plane titled by 11 to 15° from a (100) plane toward [010], [001], [0-10] or [00-1];

(2) a plane tilted by 11 to 15° from a (-100) plane toward [010], [001], [0-10] or [00-1];

(3) a plane tilted by 11 to 15° from a (010) plane toward [100], [-100], [001] or [00-1];

(4) a plane tilted by 11 to 15° from a (0-10) plane toward [100], [-100], [001] or [00-1];

(5) a plane tilted by 11 to 15° from a (001) plane toward [100], [-100], [010] or [0-10]; or (6) a plane tilted by 11 to 15° from a (00-1) plane toward [100], [-100], [010] or [0-10].

2. A light emitting diode according to claim 1, wherein the single crystal substrate of a compound of an element of III-V family with crystal structure of zinc blende type is a gallium phosphide single crystal substrate.

3. A light emitting diode according to claim 1, wherein a $GaAs_{1-x}P_x$ ($0.45<x<1$) mixed crystal epitaxial layer is provided on the single crystal substrate.

4. A light emitting diode according to claim 3, wherein the $GaAs_{1-x}P_x$ ($0.45<x<1$) mixed crystal epitaxial layer comprises a graded layer and a layer with a constant mixed crystal ratio in which a light emitting layer is formed.

5. A light emitting diode according to claim 4, wherein nitrogen is doped on the light emitting layer.

6. A light emitting diode according to claim 5, wherein a p-n junction is formed in the light emitting layer.

7. A light emitting diode according to claim 1, wherein the epitaxial layer comprises gallium phosphide arsenide mixed crystal.

8. A light emitting diode according to claim 3, wherein the epitaxial layer comprising gallium phosphide arsenide mixed crystal has nitrogen isoelectronic trap.

\* \* \* \* \*